United States Patent [19]

Buebel, Jr.

[11] 4,016,569
[45] Apr. 5, 1977

[54] NEAR FIELD ANTENNA BORESIGHT ALIGNMENT APPARATUS

[75] Inventor: Edgar W. Buebel, Jr., Cockeysville, Md.

[73] Assignee: The United States of America as represented by the Secretary of the Air Force, Washington, D.C.

[22] Filed: Oct. 3, 1975

[21] Appl. No.: 619,152

[52] U.S. Cl. .............................................. 343/703
[51] Int. Cl.² ........................................ G01R 29/10
[58] Field of Search ..................... 343/703, 17.7

[56] References Cited
UNITED STATES PATENTS

| | | | |
|---|---|---|---|
| 3,302,205 | 1/1967 | Johnson | 343/703 |
| 3,806,943 | 4/1974 | Holloway | 343/703 |

Primary Examiner—Eli Lieberman
Attorney, Agent, or Firm—Joseph E. Rusz; Willard R. Matthews, Jr.

[57] ABSTRACT

Alignment of the optical, mechanical and electrical axes of an antenna system is accomplished at short range by means of a test antenna having an aperture that is approximately 20 percent greater than the aperture of the antenna being aligned. The test antenna is positioned to receive or transmit radiation from/to the antenna being aligned at a distance of less than $D^2/\lambda$ where D is the diameter of the antenna aperture and $\lambda$ is the wavelength of the antenna operating frequency.

1 Claim, 1 Drawing Figure

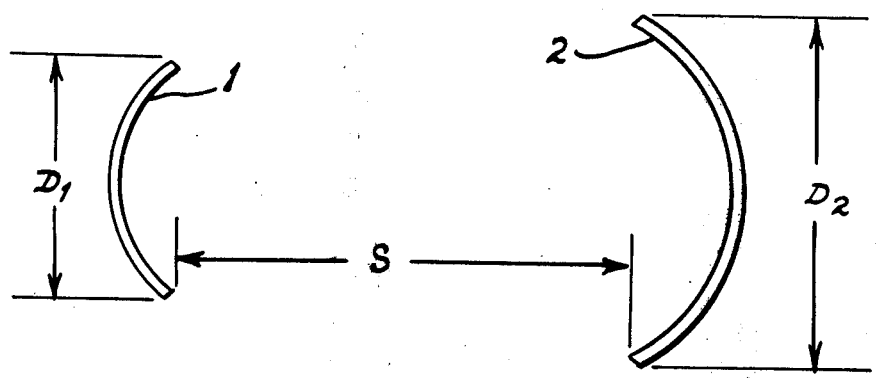

NEAR FIELD ANTENNA BORESIGHT ALIGNMENT APPARATUS

STATEMENT OF GOVERNMENT INTEREST

The invention described herein may be manufactured and used by or for the Government for governmental purposes without the payment of any royalty thereon.

BACKGROUND OF THE INVENTION

This invention relates to antenna systems, and in particular to methods and means for aligning the boresight of antenna radiating elements.

In the measurement of antenna radiation characteristics it is standard practice to operate the antenna under test and the test antenna at a separation distance equal to or greater than $2D^2/\lambda$ where D is the largest dimension of the antenna under test (or its aperture diameter) and $\lambda$ is the wavelength of operation. For most airborne radar antennas this distance is typically one hundred to two hundred feet. It is highly desirable to boresight antennas at a much shorter range, for instance, ten feet or less. The present invention is directed toward providing a method and means for accomplishing this.

SUMMARY OF THE INVENTION

The present invention comprehends the use of an oversized test antenna as a means for accomplishing near field antenna boresighting. A test antenna whose major dimension is substantially 20 percent larger than the major dimension of the antenna being tested is utilized at a separation distance of one-tenth or less the separation distance required by standard procedures.

It is a principal object of the invention to provide a new and improved antenna boresight alignment method.

It is another object of the invention to provide new and improved apparatus for effecting antenna boresight alignment.

It is another object of the invention to provide a method and means for accomplishing very short range antenna boresight alignment.

These, together with other objects, features and advantages of the invention, will become more readily apparent from the following detailed description when taken in conjunction with the illustrative embodiment in the accompanying drawing.

DESCRIPTION OF THE DRAWING

The sole figure of the drawing is a schematic representation of the apparatus of the invention.

DETAILED DESCRIPTION OF THE PREFERRED EMBODIMENT

The sole figure of the drawing illustrates, schematically, the test arrangement of antenna 1 (antenna under test) and test antenna 2 that is conventionally used in performing boresight alignment procedures. In standard practice the antenna under test and the test antenna are operated at a separation distance S equal to or greater than $2D^2/\lambda$, where D is the largest dimension of the antenna under test and $\lambda$ is the wavelength of operation.

The present invention utilizes a test antenna 2 having an aperture diameter $D_2$ that is greater, e.g. 20% greater in one embodiment than aperture diameter $D_1$ of the antenna 1 under test. It has been discovered and has been computed and empirically demonstrated that such a test antenna forms a beam wave-front that artificially meets the $2D^2/\lambda$ requirement in a much shorter distance.

By way of example, for a certain radar having a 32-inch aperture, the normal separation distance S is $2D^2/\lambda = 134$ feet. Accurate boresight measurements were conducted at a distance of S = 8 feet using a test antenna with a 36-inch aperture.

While the invention has been described in its preferred enbodiment, it is understood that the words which have been used are words of description rather than words of limitation and that changes within the purview of the appended claims may be made without departing from the scope and spirit of the invention in its broader aspects.

What is claimed is:

1. In combination with an antenna that utilizes boresight alignment apparatus of the type wherein standard practice requires $2D^2/\lambda$ spacing between antenna and test antenna, D being the antenna aperture diameter and $\lambda$ being the wavelength of the antenna operating frequency, the improvement wherein the spacing between antenna and test antenna is reduced while achieving the same results as standard practice apparatus said improvement comprising a test antenna having an aperture approximately 20 percent greater than the aperture of said antenna, said test antenna being positioned to receive radiation transmitted by said antenna at a distance therefrom of approximately $0.15 D^2/\lambda$.

* * * * *